(12) United States Patent
Otake

(10) Patent No.: US 6,204,644 B1
(45) Date of Patent: Mar. 20, 2001

(54) SWITCHING POWER SUPPLY FOR SPEEDING UP TURN-OFF OPERATION OF A SWITCHING ELEMENT

(75) Inventor: Tetushi Otake, Tokyo (JP)

(73) Assignee: Toko, Inc., Tokyo (JP)

( * ) Notice: Subject to any disclaimer, the term of this patent is extended or adjusted under 35 U.S.C. 154(b) by 0 days.

(21) Appl. No.: 09/231,017

(22) Filed: Jan. 14, 1999

(30) Foreign Application Priority Data

Jan. 30, 1998 (JP) .................................................. 10-034092

(51) Int. Cl.$^7$ ................................. G05F 1/10; G05F 1/40
(52) U.S. Cl. ........................... 323/222; 323/286; 323/282
(58) Field of Search .................................... 323/222, 282, 323/283, 284, 290; 363/49, 21, 131, 16, 97

(56) References Cited

U.S. PATENT DOCUMENTS 5,689,178 * 11/1997 Otake .................................. 323/282

FOREIGN PATENT DOCUMENTS 9-246932   9/1997 (JP) .
2586788   10/1998 (JP) .

* cited by examiner

Primary Examiner—Shawn Riley
Assistant Examiner—Rajnikant B. Patel
(74) Attorney, Agent, or Firm—Frishauf, Holtz, Goodman, Langer & Chick, P.C.

(57) ABSTRACT

A switching power supply, eliminating effect of a potential difference generated in a driving circuit, in which a rapid operation speed of a switching transistor Q1 and a high efficiency are obtained. An auxiliary bias circuit forming a polarity inversion circuit together with the switching transistor Q1 is constructed by connecting a capacitor C3 and a diode D2 in series between a collector of the switching transistor Q1 and a ground, and by connecting a diode D3 and a capacitor C4 in series between a connection point of the capacitor C3 and the diode D2 and a ground. One end of a main current path of the transistor Q3 which conducts when the switching transistor Q1 is in an OFF state, is connected to a connection point of the diode D3 and the capacitor C4 in the auxiliary bias circuit 5a, thereby supplying a voltage obtained in the auxiliary bias circuit 5a to the switching transistor Q1 via the transistor Q3. This voltage is applied as a reverse bias to the switching transistor Q1 and eliminates a voltage between a base and an emitter of the transistor Q3.

10 Claims, 3 Drawing Sheets

SWITCHING POWER SUPPLY FOR SPEEDING UP TURN-OFF OPERATION OF A SWITCHING ELEMENT

FIELD OF THE INVENTION

This invention relates to technologies to improve an operation speed of a switching element in a PWM control type switching power supply.

BACKGROUND OF THE INVENTION

The switching power supply can set an output voltage to a desired value by controlling ON and OFF operation of the switching element. FIG. 1 illustrates an example of a circuit using as such a switching power supply.

A circuit as shown in FIG. 1 is constructed as set forth below. It should be noted that in FIG. 1, reference numerals 1 and 2 indicate an input terminal and an output terminal of high potential sides, respectively, and an input terminal and an output terminal of low potential sides are omitted, but each terminal is grounded.

A choke coil L1 and a switching transistor Q1 are connected between the input terminal 1 and the ground, a diode D1 is connected between a connection point of the choke coil L1 and the switching transistor Q1, and the output terminal 2, and a smoothing capacitor C2 is connected between the output terminal 2 and the ground. A capacitor C1 for filter is connected between the input terminal 1 and the ground. A boost chopper circuit is formed by connecting these elements.

In order to operate this boost chopper circuit, a control circuit 3 and a driving circuit 4a are arranged, wherein the driving circuit 4a is formed of a resistor R2, transistors Q2 and Q3 which are connected in series, and a resistor R1 connected between the input terminal 1 and a common connection point of each base of the transistors Q2 and Q3.

A common connection point of each emitter of the transistors Q2 and Q3 in the driving circuit 4a is connected to a base of the switching transistor Q1, and a common connection point of each base of the transistors Q2 and Q3 is connected to a pulse output terminal PO of the control circuit 3. A power supply terminal Vcc of the control circuit 3 is connected to the input terminal 1, and a terminal GND is grounded. A voltage detecting terminal FB of the control circuit 3 is connected to a mid-connection point of resistors R3 and R4, which are connected in series between the output terminal 2 and the ground.

In the circuit as shown in FIG. 1, when pulse signals are supplied from the control circuit 3, the transistors Q2 and Q3 of the driving circuit 4a are operated complementarily and drives the switching transistor Q1. For example, if the pulse signal which the control circuit 3 outputs is high in voltage value, the transistor Q2 is in an ON-state and the transistor Q3 is in an OFF-state. In this case, a forward bias is applied through the resistor R2 and the transistor Q2 to the base of the switching transistor Q1, thereby the switching transistor Q1 becomes ON.

On the contrary, if the pulse signal is low in a voltage value, the transistor Q2 is in an OFF-state and the transistor Q3 is in an ON-state. In this case, a forward bias is not applied to the base of the switching transistor Q1, and the base of the transistor Q1 is grounded through the transistor Q3, so that the switching transistor Q1 becomes OFF.

In this connection, during an ON-period, positive charges are stored in a base region and negative charges in an emitter region of the switching transistor Q1. These stored charges are important in operation. This is because the switching transistor Q1 is turned to the OFF-state by extinction of the stored charges.

When the switching transistor Q1 is turned from the ON-state to the OFF-state in FIG. 1, the transistor Q3 becomes ON and short-circuits between the base and emitter of the switching transistor Q1. At this time, a discharge path of the stored charges of the base and emitter regions of the switching transistor Q1 is formed by operation of the transistor Q3 and extinction of the stored charges is improved, so that turn-off operation of the switching transistor Q1 is speeded up.

Then, in order to disappear rapidly the stored charges of the base and emitter regions of the switching transistor Q1, it is desirable that there is neither electric resistance nor potential difference to disturb a flow of the charges on a discharge path of the charges. As is well known, however, between terminals of a transistor element, the potential difference based on a PN junction thereof is caused. In this connection, in the transistor Q3 in FIG. 1 the potential difference (a voltage $V_{BE}$ between a base and an emitter) is also caused. For this, in the circuit in FIG. 1 the potential difference appears, based on a voltage between the base and emitter of the transistor Q3, on the discharge path between the base and emitter of the transistor Q1, and discharge of the stored charges is disturbed.

SUMMARY OF THE INVENTION

An object of this invention is to obtain a switching power supply in which a switching element is rapid in operation and a device is high in efficiency by eliminating an undesirable effect based on a potential difference caused in a driving circuit.

A switching power supply according to the present invention comprises; a switching element for controlling the amount of current passing through a main current path based on ON and OFF operation of the switching element; a control circuit for detecting an output voltage of a power supply and outputting pulse signals of on-duty according to the output voltage; a driving circuit for driving the switching element according to pulse signals; and an auxiliary bias circuit, connected to the driving circuit, for supplying a reverse bias voltage to a control terminal of the switching element via the driving circuit.

Another switching power supply according to the present invention comprises: a switching element for controlling an amount of current passing through a main current path based on ON and OFF operation of the switching element; a control circuit for detecting an output voltage of a power supply and outputting pulse signals of on-duty according to the output voltage; a driving circuit having a transistor to short-circuit between one terminal of a main current flow pass and a control terminal of the switching element and for driving the switching element according to the pulse signals; and an auxiliary bias circuit for applying a forward bias to the transistor of the driving circuit according to the pulse signals.

In one embodiment for realizing the present invention, the auxiliary bias circuit generating a voltage applying a reverse bias to a base of the switching element is provided to connect an output thereof to the driving circuit of the switching element.

In another embodiment for realizing the present invention, the auxiliary bias circuit generating a voltage applying a forward bias to a transistor in the driving circuit for short-circuiting between the base and emitter of a switching element is provided to connect an output thereof to the control terminal of the transistor.

The input of the auxiliary bias circuit in each embodiment is connected to one terminal of the main current path of the switching element, or one end of a predetermined winding of an inductance part. For example, the auxiliary bias circuit is formed of a circuit combined with two capacitance elements and two diodes, or a circuit combined with two capacitor elements, an inductance element and a diode.

In the switching power supply constructed as set forth above, undesirable potential difference is cancelled or not generated in the driving circuit by means of a voltage supplied from the auxiliary bias circuit. Thereby the stored charges in vicinity of each terminal of the switching element can be discharged without any difficulty. Consequently, the improved switching power supply according to the present invention is obtained in high operation speed of the switching element and high efficiency.

DESCRIPTION OF THE PREFERRED EMBODIMENTS

Figure 1:
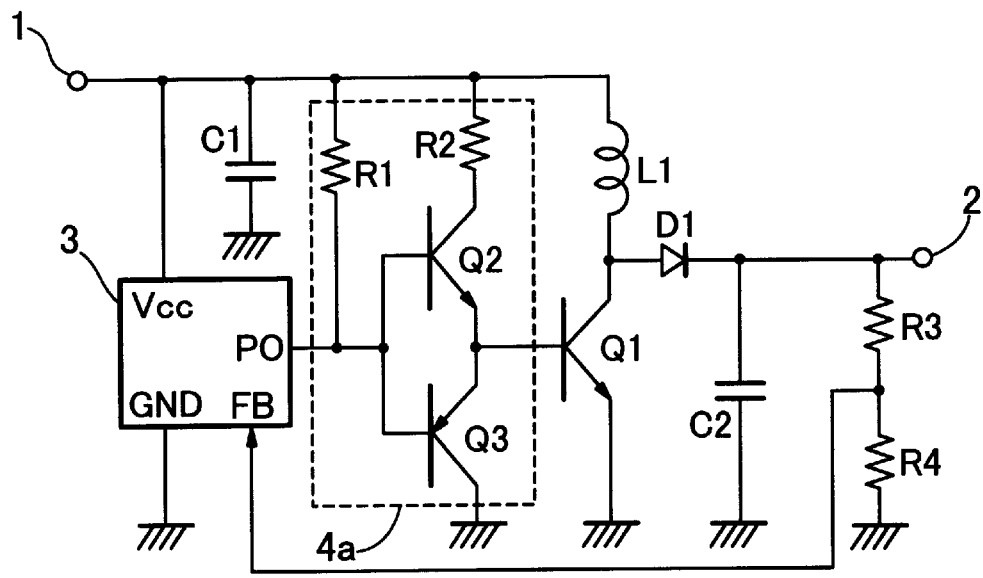
FIG. 1 is one example of a conventional switching power supply.
Figure 2:
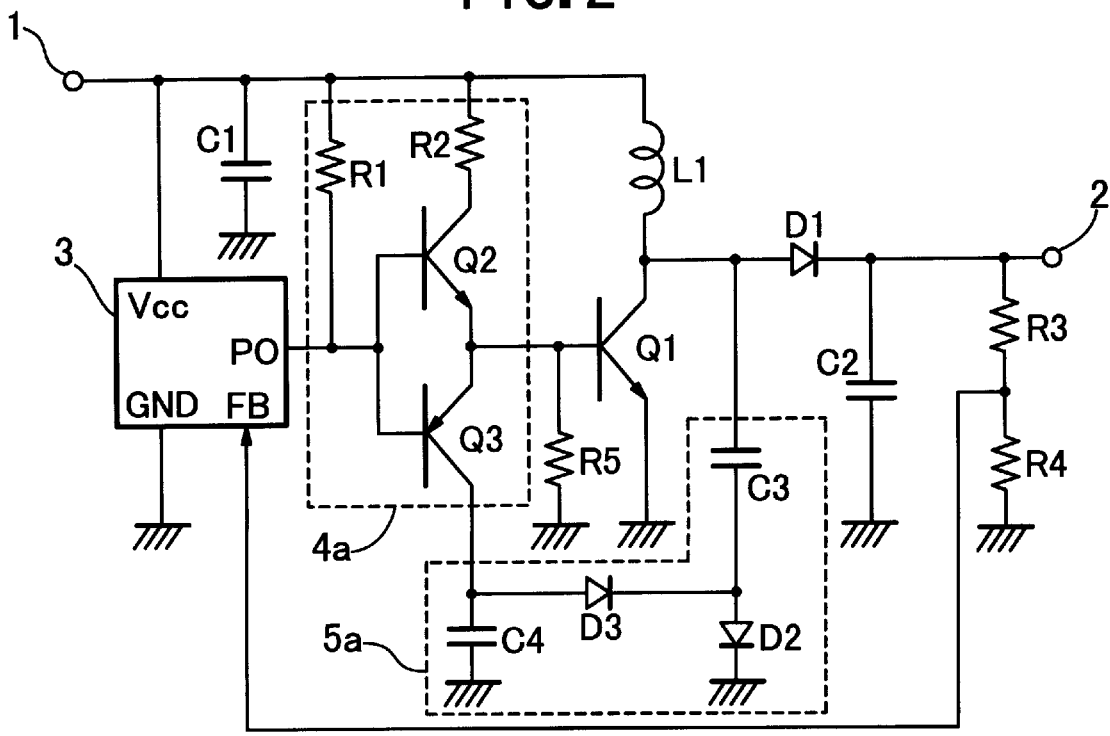
FIG. 2 is a first embodiment of a switching power supply according to the present invention.

Referring to FIG. 2, a first embodiment of the switching power supply according to the present invention, in which a switching element is improved in operation speed. It should be noted that the same structural elements in FIG. 2 as those shown in FIG. 1 are given the same reference numerals.

A circuit as shown in FIG. 2 is different from that in FIG. 1 in the following circuit parts. That is, a series circuit of a capacitor C3 and a diode D2 is connected between a connection point of a switching transistor Q1 and a choke coil L1 and a ground, and a series circuit of a capacitor C4 and a diode D3 is connected between a connection point of the capacitor C3 and the diode D2 and a ground. An auxiliary bias circuit 5a is formed of these capacitors C3, C4, and diodes D2, D3. A collector of a transistor Q3 of a driving circuit 4a is connected to a connection point of the diode D3 and the capacitor C4 in FIG. 2 while it is grounded in FIG. 1. Further, a resistor R5 is connected between a base of the switching transistor Q1 and the ground.

The other circuit structures in FIG. 2 are the same as those in FIG. 1.

In the circuit of FIG. 2 comprising the above circuit portions, the auxiliary bias circuit 5a is operated as follows.

The auxiliary bias circuit 5a as shown in FIG. 2 forms a polarity inversion circuit in conjunction with the switching transistor Q1. That is, during an OFF period of the switching transistor Q1, the capacitor C3 is charged through the diode D2, and during an ON period of the switching transistor Q1, the capacitor C3 is discharged and the capacitor C4 is charged at the same time through the diode D3. At this time a negative voltage is obtained across the capacitor C4 in an opposite direction to an output voltage appearing at an output terminal 2.

The voltage which appears across the capacitor C4 of the auxiliary bias circuit 5a is applied between a base and an emitter of the switching transistor Q1 when the transistor Q3 of the driving circuit 4a is in an ON state. This voltage between terminals of the capacitor C4 has an opposite polarity to a voltage appearing between a base and an emitter of the transistor Q3, and the voltage across the capacitor C4 has a polarity applying a reverse bias between the base and the emitter of the switching transistor Q1. For this, the voltage across the capacitor C4 functions so as to extinguish stored charges in a base-emitter region of the switching transistor Q1.

Thus, this causes the circuit in FIG. 2 to cancel a potential difference appearing between the base and the emitter of the transistor Q3 by the reverse bias supplied from the auxiliary bias circuit 5a, so that the potential difference does not appear substantially between the base and the emitter of the transistor Q1. The circuit as shown in FIG. 2 forces this reverse bias supplied by the auxiliary bias circuit 5a and forcibly extinguishes the stored charges. Thus, it is possible to highly improve the operation speed of the switching transistor Q1 in the switching power supply in FIG. 2 relative to the circuit as shown in FIG. 1 which causes extinguishing of the stored charges merely by the promotion of discharge.

In the circuit of FIG. 2, a resistor R5 is connected between the base of the switching transistor Q1 and the ground. At a starting time of a power supply in which the auxiliary bias circuit 5a does not function because of the uncharged capacitor C4, the resistor R5 is connected in order to turn the switching transistor Q1 to an OFF state. However, the resistor R5 may be omitted according to the specification of the circuit.

As described above, the circuit in FIG. 2 includes a circuit structure of a boost chopper circuit, but the present invention is applicable to the various types of power supplies.

Figure 3:
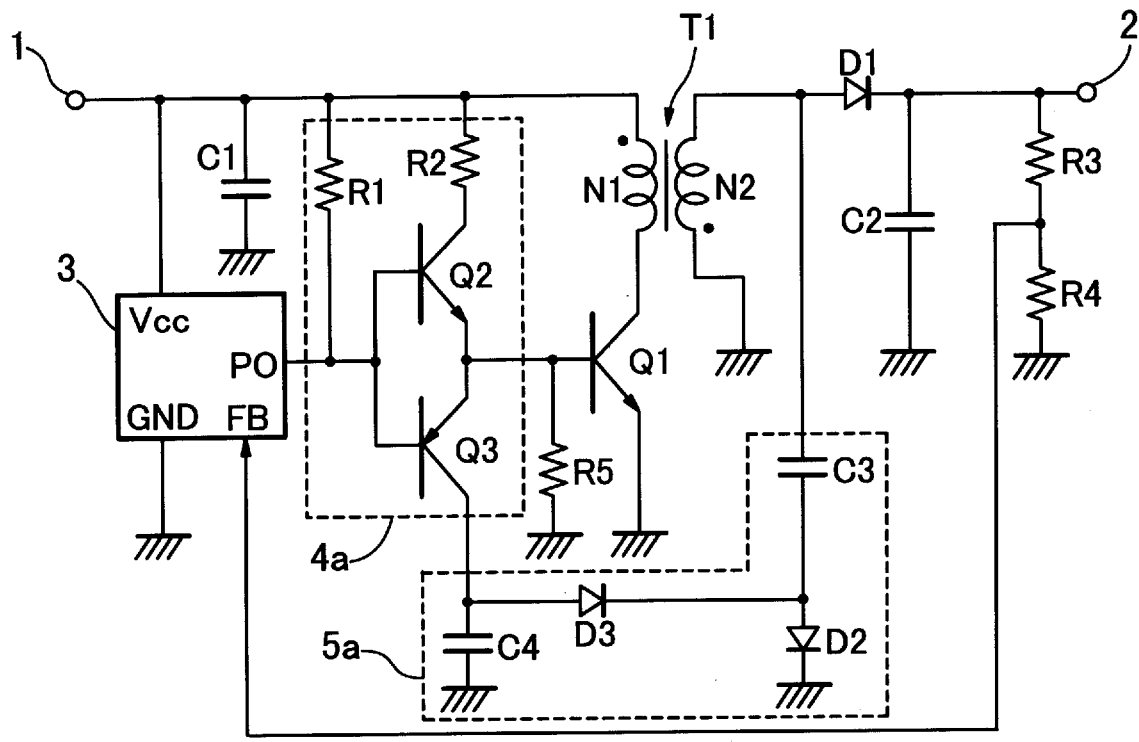
FIG. 3 is a second embodiment of the switching power supply according to the present invention.

FIG. 3 illustrates a second embodiment of the power supply according to the present invention. The circuit of FIG. 3 is such that the auxiliary bias circuit is incorporated in a flyback converter using a transformer. That is, the circuit of FIG. 3 has a circuit structure that a transformer T1 is substituted for a choke coil of the circuit of FIG. 2, and one end of a secondary winding N2 of the transformer T1 is grounded and another end of the secondary winding N2 is connected to a cathode of a diode D1 and one end of a capacitor C3 in an auxiliary bias circuit 5a. The other circuit structures in FIG. 3 are the same as those in FIG. 2.

Action and operation of the auxiliary bias circuit 5a in the circuit as shown in FIG. 3 are substantially the same as that of FIG. 2. Thus, detailed description of FIG. 3 is omitted. It should be noted that in FIG. 3, one end of the capacitor C3 of the auxiliary bias circuit 5a is connected to another end of the secondary winding N2 of the transformer T1, and even if one end of the capacitor C3 is connected to a connection point of the primary winding N1 of the transformer T1 and the switching transistor Q1, the action and operation of the overall circuit are the same as that of the circuit in FIG. 2.

Figure 4:
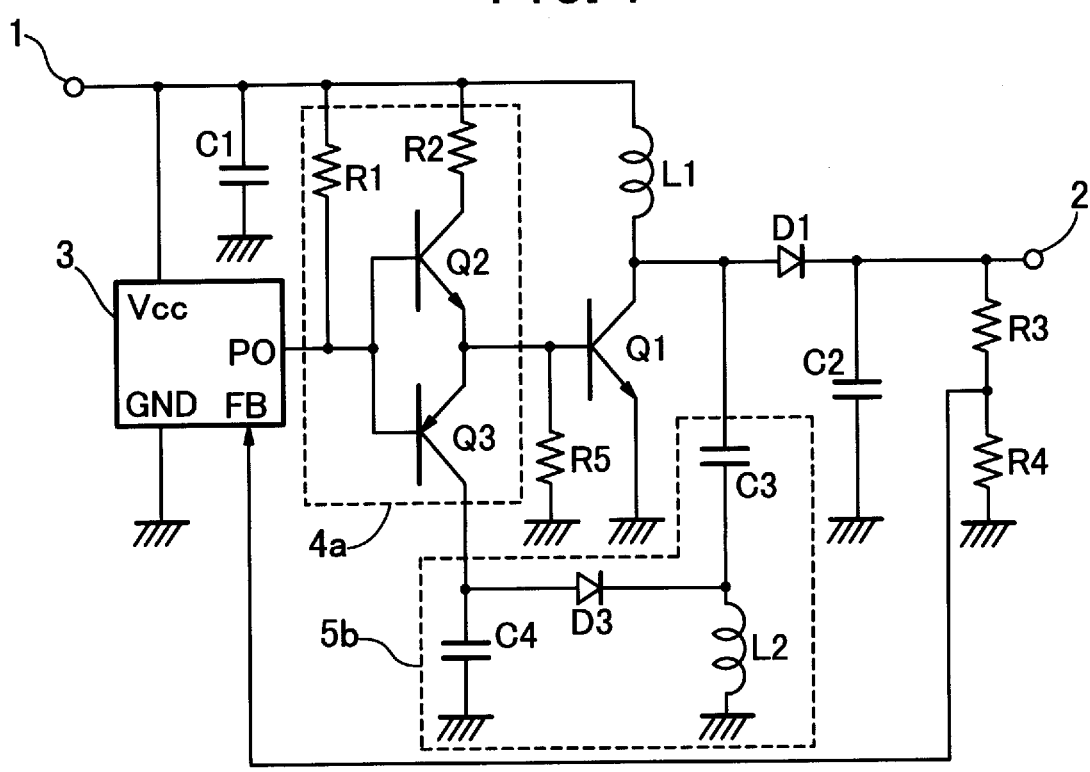
FIG. 4 is a third embodiment of the switching power supply according to the present invention.
Figure 5:
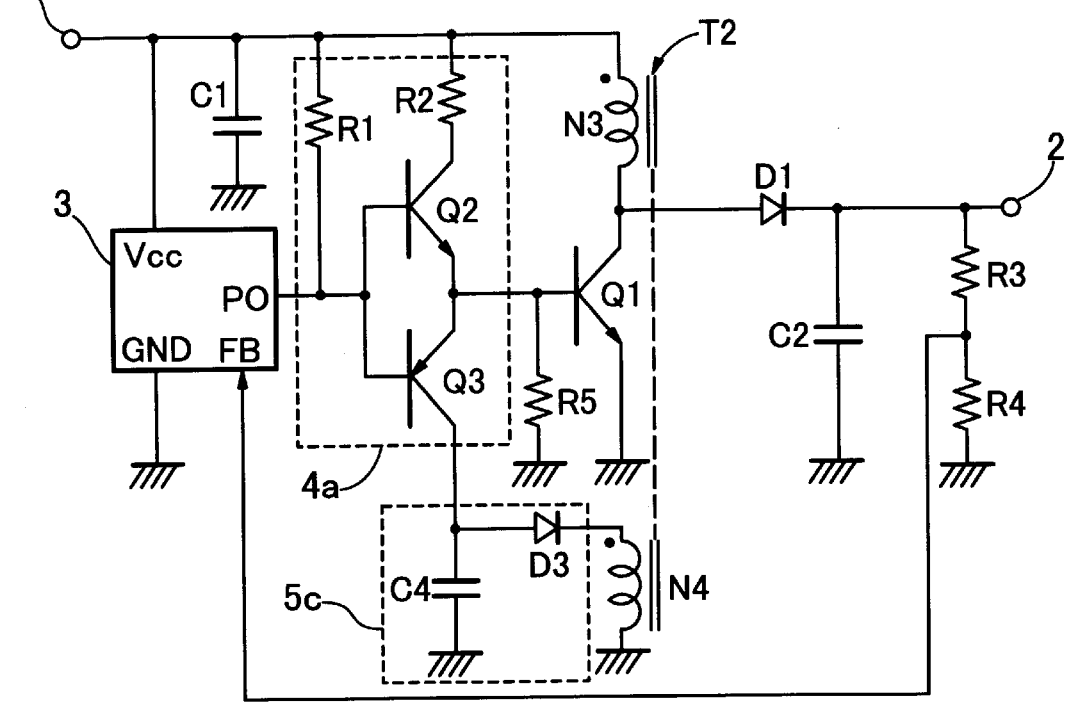
FIG. 5 is a fourth embodiment of the switching power supply according to the present invention.

The auxiliary bias circuit according to the present invention is a component having functions for supplying a reverse bias to the switching transistor Q1 and may be constructed as shown in FIGS. 4 and 5.

Referring to FIG. 4, a switching power supply of a third embodiment according to the present invention has an auxiliary bias circuit 5b in which an inductance L2 is substituted for the diode D2 as shown in FIG. 2. This auxiliary bias circuit 5b in FIG. 4 operates as set forth below. That is, when the switching transistor Q1 is in an OFF state, it causes to charge a capacitor C3, and at the same time causes the inductance L2 to store energies, and when the switching transistor Q1 is in an ON state, it causes the capacitance C3 and inductance L2 to discharge energies stored therein, and the energies allow to charge a capacitor C4.

On the other hand, referring to FIG. 5, in a switching power supply of a fourth embodiment according to the present invention, a transformer T2 is substituted for the choke coil L1 as shown in FIG. 2. A primary winding N3 of the transformer T2 is used as a choke coil, and a secondary winding N4 is a used as a dedicated winding for supplying a voltage to an auxiliary bias circuit 5c. The auxiliary bias circuit 5c is formed of a diode D3 and a capacitor C4, and it causes a voltage generated in the secondary winding N4 to charge the capacitor C4.

In each circuit in FIGS. 4 and 5, a voltage generated across the capacitor C4 is applied between a base and an emitter of the switching transistor Q1 through the transistor Q3. Thus, it is possible to cause the stored charges to be forcibly extinguished because the reverse bias is supplied between the base and the emitter of the switching transistor Q1.

Figure 6:
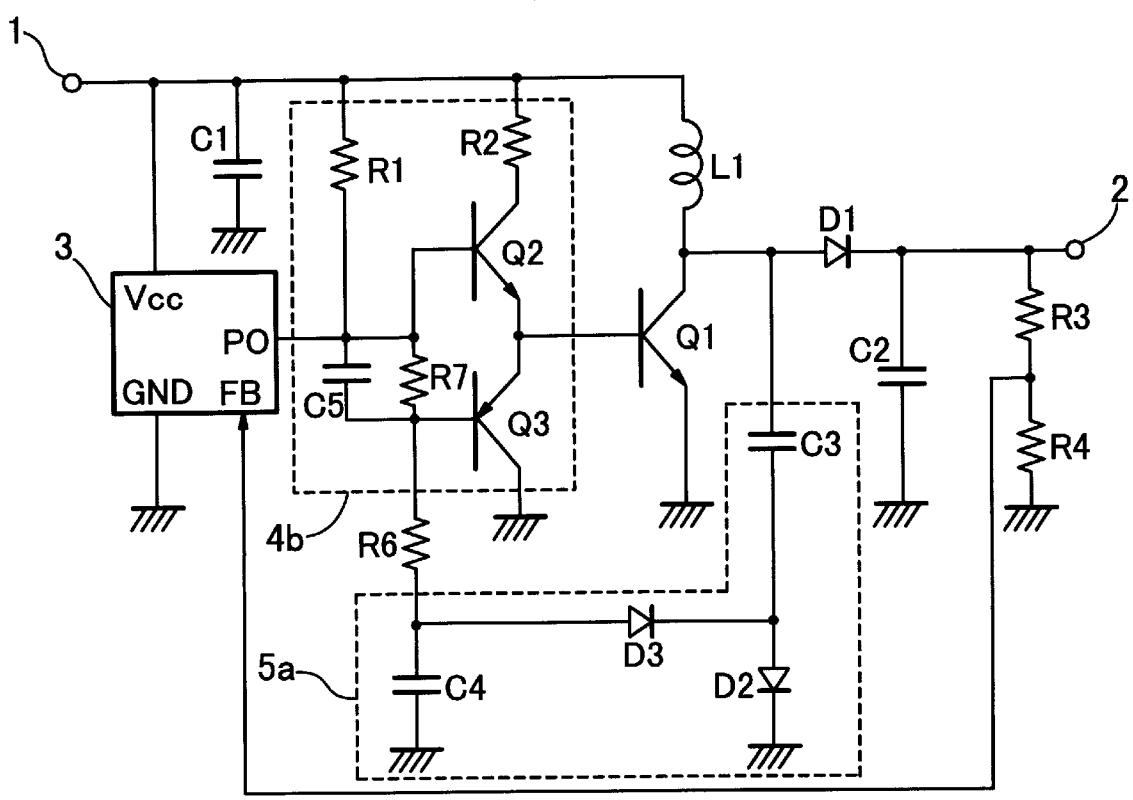
FIG. 6 is a fifth embodiment of the switching power supply according to the present invention.

FIG. 6 shows a switching power supply of a fifth embodiment according to the present invention. In the embodiment in FIG. 2 through FIG. 5, the stored charges are extinguished forcibly by applying the reverse bias to the switching transistor Q1 via the transistor Q3 in the driving circuit 4a. For this, the switching power supply is formed so as to supply a voltage obtained in the auxiliary bias circuit to one end (collector) of the main current path of the transistor Q3. On the contrary, in a circuit in FIG. 6, the stored charges of the switching transistor Q1 are extinguished early by applying a voltage obtained in the auxiliary bias circuit to a circuit position which is different from those as shown in FIG. 2 through FIG. 5.

A circuit as shown in FIG. 6 is constructed as set forth below.

A resistor R2, transistors Q2 and Q3 are connected in series between an input terminal 1 and a ground. A parallel circuit of a resistor R7 and a capacitor C5 is connected between bases of the transistors Q2 and Q3, and a resistor R1 is connected between the base of the transistor Q2 and the input terminal 1, thereby forming a driving circuit 4b.

A common connection point of collectors of the transistors Q2 and Q3 is connected to a base of the switching transistor Q1. A base of the transistor Q2 is connected to a pulse output terminal PO of a driving circuit 3, and a base of the transistor Q3 is connected to a connection point of a capacitor C4 and a diode D3 in an auxiliary bias circuit 5a via a resistor R6. The other circuit structures in FIG. 6 are the same as those in FIG. 2.

Forming like this, when pulse signals of a control circuit 3 are in a low voltage state, a large forward bias is supplied by the auxiliary bias circuit 5a to the base of the transistor Q3. For example, now, it is assumed that a voltage higher than that between the base and emitter of the transistor Q3 is obtained across the capacitor C4. When the large forward bias is supplied to the base of the transistor Q3 from the capacitor C4, there generates little an electric resistance and a potential difference between the collector and emitter of the transistor Q3. As a result, discharge of the stored charges of the base-emitter region of the switching transistor Q1 can be performed without any obstacle.

In the circuit in FIG. 6, like that in FIG. 2, it is possible that the potential difference between the base and emitter of the transistor Q3 does not appear substantially between the base and emitter of the switching transistor Q1. Further, comparing with the conventional circuit as shown in FIG. 1, it is possible to improve the operation speed of the switching transistor Q1.

What is claimed is:

1. A switching power supply comprising:
   a switching element for controlling the amount of current passing through a main current path on an ON and OFF operation;
   a controlling circuit for detecting an output voltage of said power supply, and outputting pulse signals of on-duty according to said output voltage;
   a driving circuit for driving said switching element according to said pulse signals; and
   an auxiliary bias circuit connected between one end of said main current path of said switching element and said driving circuit, for supplying a reverse bias voltage to a control terminal of said switching element via said driving circuit when said switching element is turned off.

2. The switching power supply according to claim 1, wherein said auxiliary bias circuit forms a polarity inversion circuit with said switching element.

3. A switching power supply comprising:
   a switching element for controlling the amount of current passing through a main current path on an ON and OFF operation;
   a controlling circuit for detecting an output voltage of said power supply, and outputting pulse signals of on-duty according to said output voltage;
   a driving circuit for driving said switching element according to said pulse signals;
   an inductance part, a first winding thereof being connected to said switching element; and
   an auxiliary bias circuit, connected between a second winding of said inductance part and said driving circuit, for supplying a reverse bias voltage to a control terminal of said switching element via said driving circuit when said switching element is turned off.

4. The switching power supply according to claim 3, wherein said inductance part is a choke coil, and said first and second windings are a common winding.

5. A switching power supply comprising:
   a switching element for controlling the amount of current passing through a main current path based on an ON and OFF operation;
   a controlling circuit for detecting an output voltage of said power supply, and outputting pulse signals of on-duty according to said output voltage;
   a driving circuit, having a transistor short-circuiting between one end of a main current path and a control terminal of said switching element when said switching element is turned-off, for driving said switching element according to said pulse signals;
   an inductance part, a first winding thereof being connected to said switching element; and
   an auxiliary bias circuit, connected between a second winding of said inductance part and a control terminal of said transistor, for supplying a forward bias to said transistor when said transistor is turned on.

6. The switching power supply according to claim 5, wherein said inductance part is a choke coil, and said first and second windings are a common winding.

7. A switching power supply comprising:

a switching element for controlling the amount of current passing through a main current path based on an ON and OFF operation;

a controlling circuit for detecting an output voltage of said power supply, and outputting pulse signals of on-duty according to said output voltage;

a driving circuit for driving said switching element according to said pulse signals;

an auxiliary bias circuit, connected between one end of said main current path of said switching element and said driving circuit, and forming a polarity inversion circuit with said switching element, for supplying a direct-current voltage, which is obtained from said polarity inversion circuit and which has a polarity opposite that of the output voltage of said power supply, to a control terminal of said switching element via said driving circuit as a reverse bias voltage when said switching element is turned off.

8. The switching power supply according to claim 7, wherein said auxiliary bias circuit includes a first capacitor (C3) connected to said one end of said main current path of said switching element, a second capacitor (C4) connected to said driving circuit, and a diode (D3) connected between said first and second capacitors, wherein said auxiliary bias circuit supplies a direct-current voltage, which is obtained between terminals of said second capacitor and which has a polarity opposite that of the output voltage of said power supply, to said control terminal of said switching element via said driving circuit as a reverse bias voltage when said switching element is turned off.

9. A switching power supply comprising:

a switching element for controlling the amount of current passing through a main current path based on an ON and OFF operation;

a controller circuit for detecting an output voltage of said power supply, and outputting pulse signals of on-duty according to said output voltage;

a driving circuit having a transistor short-circuiting between one end of a main current path and a control terminal of said switching element when said switching element is turned off, for driving said switching element according to said pulse signal;

an auxiliary bias circuit connected between said one end of said main current path of said switching element and a control terminal of said transistor, and forms a polarity inversion circuit with said switching element for supplying a direct-current voltage, which is obtained from said polarity inversion circuit and which has a polarity opposite that of the output voltage of said power supply, to said control terminal of said transistor as a forward bias voltage when said transistor is turned-on.

10. The switching power supply according to claim 9, wherein said auxiliary bias circuit includes a first capacitor (C3) connected to said one end of said main current path of said switching element, a second capacitor (C4) connected to said control terminal of said transistor, and a diode (D3) connected between said first and second capacitors, wherein said auxiliary bias circuit supplies a direct-current voltage, which is obtained between terminals of said second capacitor and which has a polarity opposite that of the output voltage of said power supply, to said control terminal of said transistor as a forward bias voltage when said transistor is turned-on.

* * * * *